US012792533B2

(12) United States Patent
Vankayala

(10) Patent No.: US 12,792,533 B2
(45) Date of Patent: Nov. 10, 2026

(54) INTER-DIE CONNECTORS FOR DATA AND ERROR CORRECTION INFORMATION AND RELATED METHODS AND APPARATUSES

(71) Applicant: Lodestar Licensing Group LLC, Evanston, IL (US)

(72) Inventor: Vijayakrishna J. Vankayala, Allen, TX (US)

(73) Assignee: Lodestar Licensing Group LLC, Evanston, IL (US)

( * ) Notice: Subject to any disclaimer, the term of this patent is extended or adjusted under 35 U.S.C. 154(b) by 51 days.

(21) Appl. No.: 18/936,671

(22) Filed: Nov. 4, 2024

(65) Prior Publication Data

US 2025/0061067 A1 Feb. 20, 2025

Related U.S. Application Data

(63) Continuation of application No. 18/365,794, filed on Aug. 4, 2023, now Pat. No. 12,141,084, which is a (Continued)

(51) Int. Cl.
*G06F 13/16* (2006.01)
*G06F 11/10* (2006.01)

(Continued)

(52) U.S. Cl.
CPC ...... *G06F 13/1668* (2013.01); *G06F 11/1004* (2013.01); *G06F 11/1076* (2013.01);

(Continued)

(58) Field of Classification Search
CPC ............. G06F 13/1668; G06F 11/1004; G06F 11/1076; G06F 11/1048; H10W 90/00;

(Continued)

(56) References Cited

U.S. PATENT DOCUMENTS 10,002,647 B1 6/2018 Vankayala
10,083,723 B1 9/2018 Vankayala (Continued)

FOREIGN PATENT DOCUMENTS

CN 102473126 A 5/2012
CN 110827872 A 2/2020

(Continued)

OTHER PUBLICATIONS

Chinese First Office Action for Chinese Application No. 202180021506.9, dated May 6, 2023, 24 pages with translation.

(Continued)

*Primary Examiner* — Albert Decady
*Assistant Examiner* — Grace V Braden
(74) *Attorney, Agent, or Firm* — TraskBritt

(57) ABSTRACT

Apparatuses for transfer of data and error correction between semiconductor dies are disclosed. An apparatus may include a number of dies including a first die and a second die. The first die may be configured to receive data bits and error correction information from the second die via inter-die connectors. The first die may further be configured to generate new error correction information corresponding to the data bits via the error correction circuitry. Further, the first die may be configured to write the data bits to data storage elements responsive to a determination that the error correction information matches the new error correction information.

20 Claims, 10 Drawing Sheets

Related U.S. Application Data continuation of application No. 17/807,186, filed on Jun. 16, 2022, now Pat. No. 11,755,506, which is a continuation of application No. 16/819,914, filed on Mar. 16, 2020, now Pat. No. 11,366,772.

(51) Int. Cl.
*H10W 90/00* (2026.01)
*H10W 90/20* (2026.01)
*H10W 90/24* (2026.01)
*H10W 90/26* (2026.01)

(52) U.S. Cl.
CPC ............ *H10W 90/00* (2026.01); *H10W 90/24* (2026.01); *H10W 90/26* (2026.01); *H10W 90/291* (2026.01); *H10W 90/297* (2026.01); *H10W 90/752* (2026.01); *H10W 90/754* (2026.01)

(58) Field of Classification Search
CPC ................. H10W 90/24; H10W 90/26; H10W 90/291; H10W 90/297; H10W 90/752; H10W 90/754; H10W 90/271; H10W 90/722; H10W 90/724
See application file for complete search history.

(56) References Cited

U.S. PATENT DOCUMENTS

| | | | | |
|---|---|---|---|---|
| 11,366,772 | B2 | 6/2022 | Vankayala | |
| 11,367,686 | B2 * | 6/2022 | Fricker | H10W 42/00 |
| 11,755,506 | B2 | 9/2023 | Vankayala | |
| 12,181,966 | B2 * | 12/2024 | Bains | G06F 11/106 |
| 12,417,030 | B2 * | 9/2025 | Vlaiko | G06F 3/0619 |
| 2008/0239808 | A1 | 10/2008 | Lin | |
| 2010/0169741 | A1 | 7/2010 | Laurent et al. | |
| 2011/0041005 | A1 | 2/2011 | Selinger | |
| 2014/0063887 | A1 | 3/2014 | Vogelsang | |
| 2016/0357630 | A1 | 12/2016 | Kang et al. | |
| 2017/0125119 | A1 | 5/2017 | Loh et al. | |
| 2018/0095821 | A1 | 4/2018 | Vogt | |
| 2018/0276073 | A1 | 9/2018 | Ide et al. | |
| 2019/0348081 | A1 | 11/2019 | Vankayala et al. | |
| 2020/0059226 | A1 | 2/2020 | Choi et al. | |
| 2021/0089395 | A1 | 3/2021 | Song et al. | |
| 2021/0124659 | A1 | 4/2021 | Ryu et al. | |
| 2021/0200625 | A1 | 7/2021 | Park | |

FOREIGN PATENT DOCUMENTS

| | | | |
|---|---|---|---|
| KR | 10-0330575 | B1 | 3/2002 |
| KR | 10-0379812 | B1 | 3/2003 |
| KR | 10-2016-0021556 | A | 2/2016 |
| KR | 10-2017-0050935 | A | 5/2017 |

OTHER PUBLICATIONS

International Search Report for Application No. PCT/US2021/019336, mailed Jun. 15, 2021, 4 pages.
Written Opinion of the International Searching Authority for Application No. PCT/US2021/019336, mailed Jun. 15, 2021, 6 pages.
Korean Notice of Reasons for Rejection for Korean Application No. 10-2022-7031945, dated Jun. 18, 2025, 13 pages with English translation.

* cited by examiner

INTER-DIE CONNECTORS FOR DATA AND ERROR CORRECTION INFORMATION AND RELATED METHODS AND APPARATUSES

CROSS-REFERENCE TO RELATED APPLICATION

This application is a continuation of U.S. patent application Ser. No. 18/365,794, filed Aug. 4, 2023, now U.S. Pat. No. 12,141,084, issued Nov. 12, 2024, which is a continuation of U.S. patent application Ser. No. 17/807,186, filed Jun. 16, 2022, now U.S. Pat. No. 11,755,506, issued Sep. 12, 2023, which is a continuation of U.S. patent application Ser. No. 16/819,914, filed Mar. 16, 2020, now U.S. Pat. No. 11,366,772, issued Jun. 21, 2022, the disclosure of each of which is hereby incorporated herein in its entirety by this reference.

TECHNICAL FIELD

The present disclosure relates, generally, to inter-die connectors and transfer of data and error correction information between semiconductor dies. More specifically, the present disclosure relates to transfer of read and write data bits and associated error correction information between a master die and one or more target dies.

BACKGROUND

DDR5 uses a burst length of sixteen in contrast to DDR4, which uses a burst length of eight. In DDR4 the eight bits and two bits of cyclic redundancy check (CRC) information were transmitted in several bursts over two inter-die connectors. Since the number of burst length of DDR5 is double that of DDR4, the data would be clocked at a higher rate in DDR5 as compared to that of DDR4 if the same memory device architecture of DDR4 were used in DDR5. This increased clock speed, however, would exceed tolerances of inter-die connectors such as through-silicon vias (TSVs). As a result, the memory device architecture of DDR4 may be altered to accommodate the higher burst length of DDR5.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
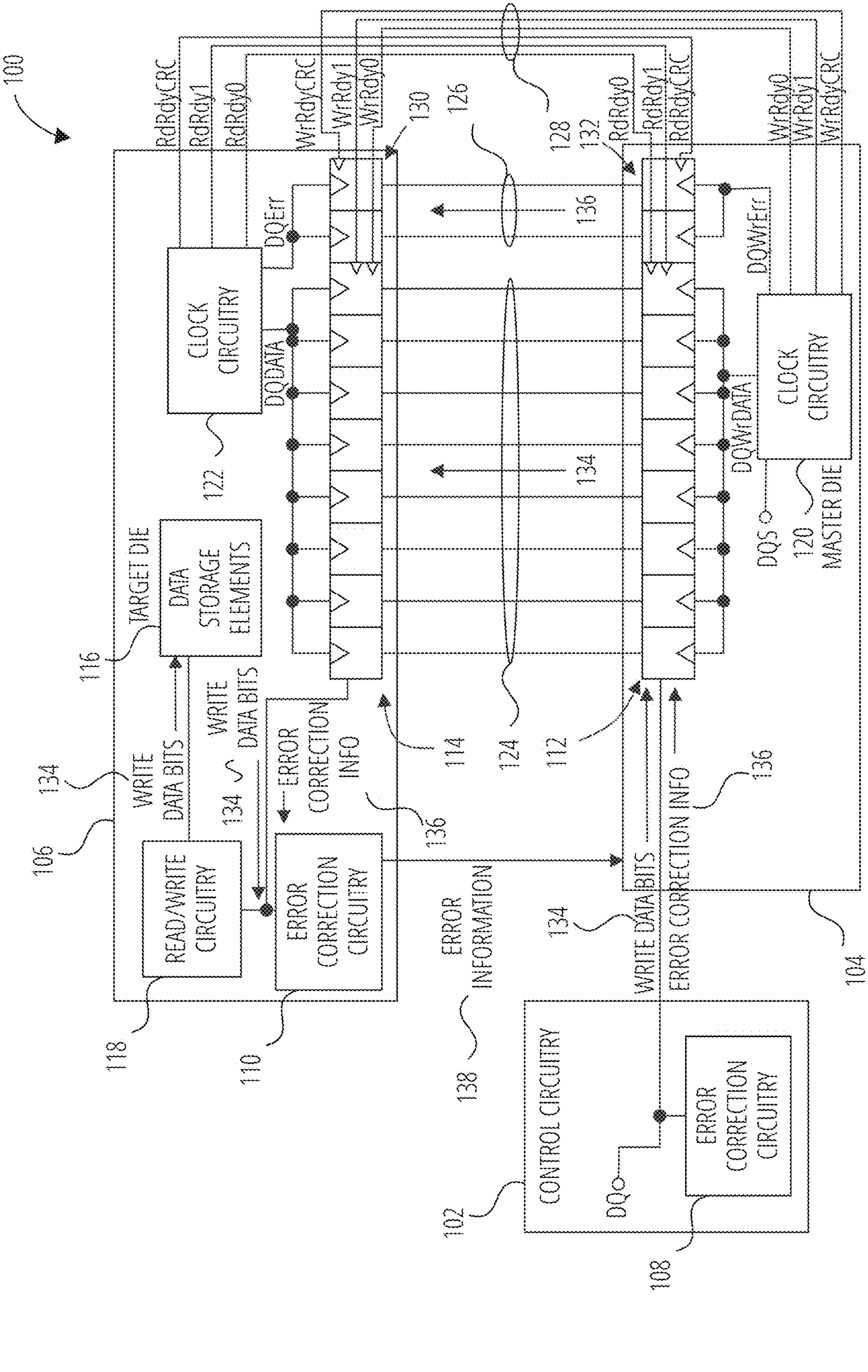
FIG. 1 is a block diagram of a memory apparatus illustrating a write operation, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Embodiments disclosed herein may be used in DDR5. In some embodiments, error correction circuitry (e.g., CRC circuitry) on a target die is used to handle read CRC. Read data bits are sent to the error correction circuitry on the target die and 2-bit error correction information (e.g., CRC data) is generated. These two additional bits are transmitted back to the master die along with the 16 bits of data. In a DQ double pump scheme, eight data bits are sent at a time to the master die without waiting for the CRC calculation. Read ready signals are sent along with the data to the master die to enable latching of data on the master die. This is done to keep data transfer as fast as possible. The two error correction bits and a read ready CRC (RdRdyCRC) signal are sent to the master die when the CRC calculation is complete. The delay on the CRC bits is acceptable as they are the last bits of the read burst. The data bits toggle every eight clock edges (four clocks) in double pump scheme and the CRC bits toggle every eighteen clock edges (nine clocks).

In the write case, the serial data is parallelized and eight data bits are sent at a time to the target die along with write ready signals. The CRC calculation is started on the target as soon as all sixteen bits are available. The two-bit error correction information (CRC data) is sent along with a write ready CRC signal (WrRdyCRC) and compared with the CRC result. The CRC error is transmitted back to the master die to enable firing of an alert pad if necessary. The data bits toggle every eight clock edges (four clocks) in a double pump scheme and the CRC bits toggle every eighteen clock edges (nine docks).

Embodiments disclosed herein integrate seamlessly with the DQ double pump scheme used on DDR4. The RdRdyCRC and WrRdyCRC bits track the CRC bits and improve their latching timing on the master die. The two additional lines (inter-die error correction connectors) added to transmit the CRC bits relax the write data latching timing, which was a bottleneck on DDR4 designs (data in lines toggled every 1.25 nanoseconds (ns) on DDR4, but at 2.5 ns on DDR5).

FIG. 1 is a block diagram of a memory apparatus 100 illustrating a write operation, according to some embodiments. The memory apparatus 100 includes a master die 104 operably coupled to a target die 106 and to control circuitry 102. The master die 104 and the target die 106 may be part of a stack of dies operably coupled together using inter-die data connectors 124, inter-die error correction connectors 126, and inter-die clock connectors 128. The inter-die data connectors 124, the inter-die error correction connectors 126, and the inter-die clock connectors 128 may include through silicon vias (TSVs), wire bond features, or a combination of TSVs and wire bond features. The inter-die data connectors 124 may be configured to communicate write data bits 134 received by the master die 104 (e.g., via a DQ line) from the control circuitry 102 to the target die 106. The inter-die error correction connectors 126, which are separate from the inter-die data connectors 124, may be configured to conduct error correction information 136 (e.g., cyclic redundancy check bits (CRC bits)) corresponding to the write data bits 134 to the target die 106.

In DDR4 configurations two write data bits at a time are conducted via inter-die connectors from a master die to a target die until eight write data bits have been conducted to the target die, followed by a pair of error correction bits conducted over the same inter-die connectors as the write data bits. These error correction bits are used by the target die to determine whether the write data bits have been altered along the conductive pathway between the control circuitry and the target die. In contrast, in the memory apparatus 100 of FIG. 1, error correction information 136 is conducted to the target die 106 over inter-die error correction connectors 126, which are separate from the inter-die data connectors 124 that conduct the write data bits 134. As a specific, non-limiting example, two sets of eight write data bits 134 are conducted to the target die 106 through the inter-die data connectors 124 for every two bits of error correction information 136 (e.g., CRC bits) that are conducted to the target die 106 through the inter-die error correction connectors 126.

The control circuitry 102 includes error correction circuitry 108 configured to generate the error correction information 136 based on the write data bits 134. For example, the error correction circuitry 108 may compute an outcome of a function taking the write data bits 134 as inputs. The error correction information 136 may include this outcome of the function.

The target die 106 also includes error correction circuitry 110 configured to compute a new outcome of the same function used by the error correction circuitry 108 of the control circuitry 102. If any of the write data bits 134, as received by the target die 106 from the master die 104, have changed, the new outcome of the function, as computed by the error correction circuitry 110, will be different from the outcome. As a result, the error correction circuitry 110 may compare the outcome from the error correction circuitry 108, as indicated by the error correction information 136, to the new outcome computed based on the write data bits 134 received at the error correction circuitry 110 of the target die 106. If the new outcome computed based on the write data bits 134 received at the error correction circuitry 110 is the same as the outcome received in the error correction information 136, the read/write circuitry 118 may be configured to write the write data bits 134 to data storage elements 116 of the target die 106. If, on the other hand, the new outcome is different from the outcome indicated by the error correction information 136, the error correction circuitry 110 may be configured to provide error information 138 to the master die 104. The error information 138 may be configured to indicate that an error occurred, preventing the target die 106 from writing the write data bits 134 to the data storage elements 116. The control circuitry 102 may be configured to receive the error information 138 from the master die 104 and repeat a write operation for the write data bits 134 responsive to the error information 138.

The master die 104 includes master data shift registers 112 configured to shift and store the write data bits 134. The master data shift registers 112 are operably coupled to the inter-die data connectors 124. The target die 106 includes target data shift registers 114, which are also operably coupled to the inter-die data connectors 124. As a result, the target data shift registers 114 are operably coupled to the master data shift registers 112. The master data shift registers 112 are configured to shift the write data bits 134 to the target data shift registers 114.

The master die 104 also includes master error shift registers 132 configured to shift and store bits of the error correction information 136. The master error shift registers 132 are operably coupled to the inter-die error correction connectors 126. The target die 106 includes target error shift registers 130, which are also operably coupled to the inter-die error correction connectors 126. As a result, the master error shift registers 132 are configured to shift the error correction information 136 to the target error shift registers 130.

The master die 104 also includes clock circuitry 120 configured to receive a clock signal DQS and generate various other clock signals. The clock circuitry 120 is configured to generate a DQWrDATA signal configured to clock the master data shift registers 112 to shift the write data bits 134 and the error correction information 136 along the master data shift registers 112. The clock circuitry 120 is also configured to generate a DQWrErr signal configured to clock the master error shift registers 132 to shift the error correction information 136 along the master error shift registers 132. The clock circuitry 120 is further configured to generate write ready signals WrRdy0, WrRdy1, and WrRdyCRC. The WrRdy0 signal, when clocked, is configured to shift a first half of the write data bits 134 from the master data shift registers 112 to the target data shift registers 114 when the first half of the write data bits 134 are shifted to the master data shift registers 112. Similarly, when clocked, the WrRdy1 signal, is configured to shift the second half of the write data bits 134 from the master data shift registers 112 to the target data shift registers 114 when the second half of the write data bits 134 are shifted to the master data shift registers 112. The WrRdyCRC signal, when clocked, is configured to shift the error correction information 136 from the master error shift registers 132 to the target error shift registers 130 when the error correction information 136 is shifted to the master error shift registers 132. More detail regarding the write ready signals is discussed with reference to FIG. 1.

The target die 106 includes clock circuitry 122 configured to generate a DQDATA signal configured to clock the target data shift registers 114 to shift the write data bits 134 and the error correction information 136 along the target data shift registers 114. The target data shift registers 114 are configured to deliver shifted bits of the write data bits 134 and the error correction information 136 to the error correction circuitry 110 and the read/write circuitry 118. The clock circuitry 122 is also configured to generate a DQErr signal configured to clock the target error shift registers 130 to shift the error correction information 136 along the target error shift registers 130. The clock circuitry 122 is further configured to generate read ready signals RdRdy0, RdRdy1, and RdRdyCRC, which are relevant to read operations of the item memory apparatus 100. More detail regarding read operations and the read ready signals will be discussed below with reference to FIG. 3 and FIG. 4.

In some embodiments, the data storage elements 116 include memory cells. By way of non-limiting example the data storage elements 116 may include dynamic random-access memory cells (e.g., each include a charge storage element such as a capacitor operably coupled to a switching element such as a transistor), static random-access memory (SRAM) cells, Flash memory cells, magnetic random-access memory (MRAM), resistive random-access memory (RRAM), spin torque transfer (STT) memory cells, ferromagnetic random-access memory (FRAM) cells, phase change memory cells, other memory cells, or combinations thereof.

In some embodiments, the master die 104 includes eight master data shift registers 112 operably coupled to eight inter-die data connectors 124 and two master error shift registers 132 operably coupled to two target error shift registers 130. In such embodiments, the target die 106 may include eight target data shift registers 114 operably coupled to the eight inter-die data connectors 124 and two target error shift registers 130 operably coupled to the two inter-die error correction connectors 126. Accordingly, two bursts of eight write data bits 134 and a single burst of two bits of error correction information 136 may be transferred from the master die 104 to the target die 106 during nine clock cycles.

Figure 2:
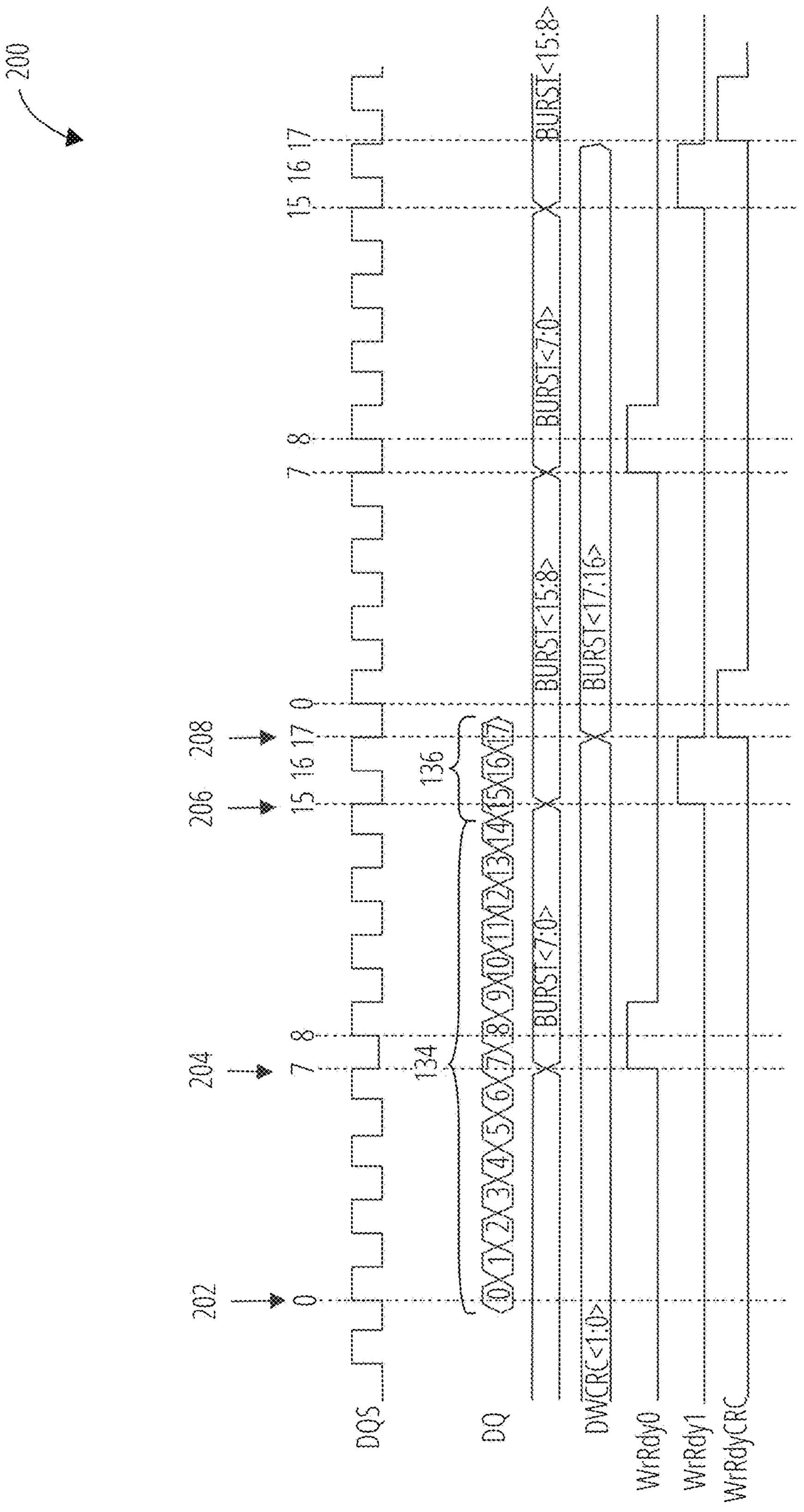
FIG. 2 is a signal timing diagram illustrating signals relevant to a write operation using the memory apparatus of FIG. 1, according to some embodiments.

FIG. 2 is a signal timing diagram 200 illustrating signals relevant to a write operation using the memory apparatus 100 of FIG. 1, according to some embodiments. Referring to FIG. 1 and FIG. 2 together, the signal timing diagram 200 includes examples of the DQS signal, the DQ signal, the WrRdy0 signal, the WrRdy1 signal, and the WrRdyCRC signal of FIG. 1. At time 202 (0 clock edges) the DQ signal starts providing the write data bits 134 starting at write data bit 0. From time 202 to time 204 (7 clock edges) the DQ signal transitions at edges of the DQS signal from write data bit 0 through write data bit 7, which correspond to the first half (eight bits) of the write data bits 134. Accordingly, after eight edges (four clock cycles) of the DQS signal the first eight bits of the write data bits 134 are in the master data shift registers 112 and the WrRdy0 signal cycles at time 204 to shift the first eight bits (BURST<7:0>) of the write data bits 134 to the target data shift registers 114.

At time 204 the DQ signal starts providing the second half of the write data bits 134 and two bits of error correction information starting at write data bit 8. From time 204 to time 206 (15 clock edges) the DQ signal transitions at edges of the DQS signal from write data bit 8 through write data bit 15 and from a first bit to a second bit of the error correction information 136, which correspond to the second half (eight bits) of the write data bits 134 and the error correction information 136, respectively. Accordingly, after eight edges (four clock cycles) of the DQS signal the second eight bits of the write data bits 134 are in the master data shift registers 112 and the WrRdy1 signal cycles at time 206 to shift the second eight bits (BURST<15:8>) of the write data bits 134 to the target data shift registers 114. At time 208 (17 clock edges) the bits of the error correction information 136 are positioned in the master error shift registers 132 and the WrRdyCRC signal cycles to shift the error correction information 136 (<Burst 17:16>) from the master error shift registers 132 to the target error shift registers 130. Following time 208 another set of write data bits and error correction information may be sent in a similar way from 0 to 17 clock edges.

Figure 3:
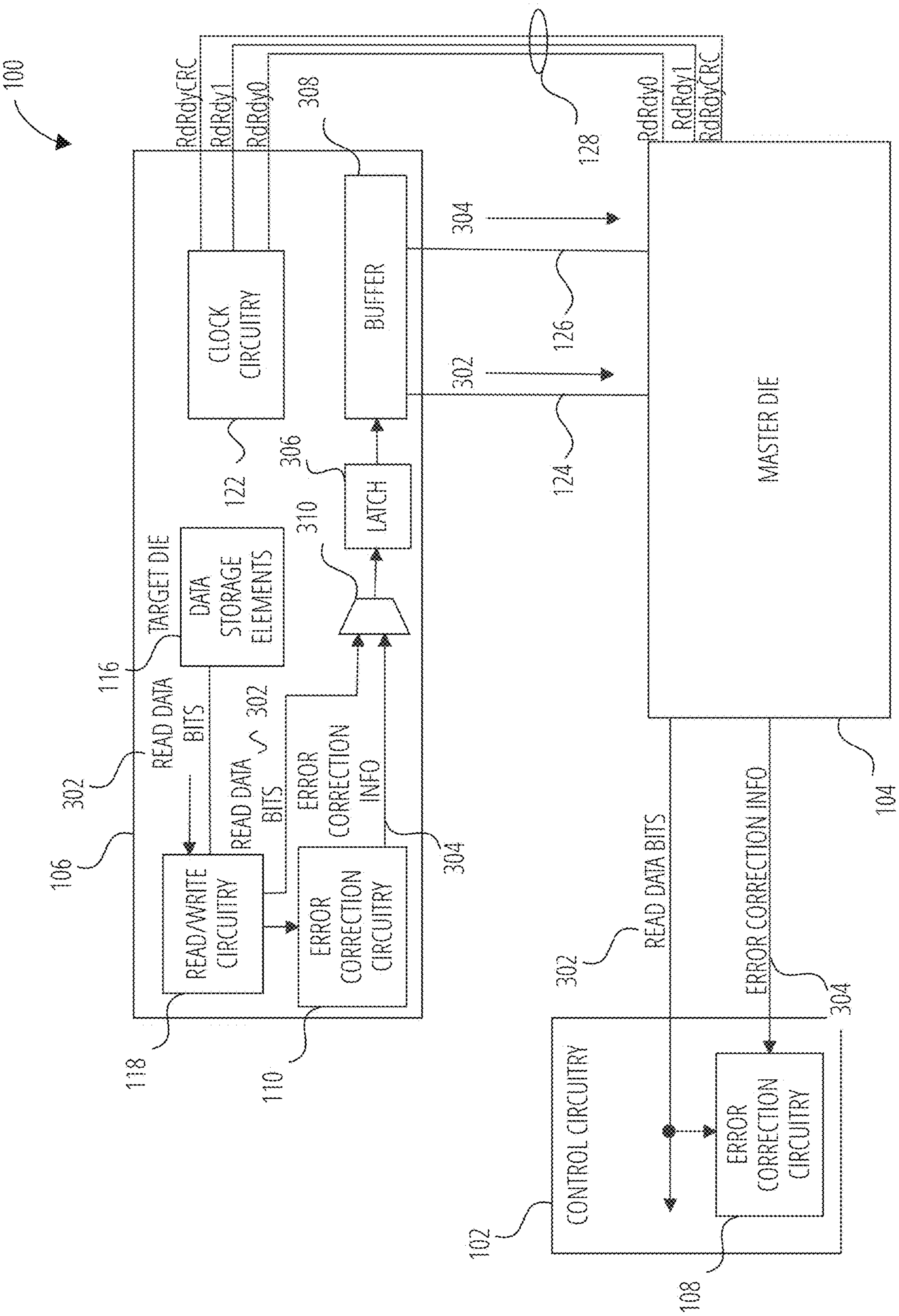
FIG. 3 is a block diagram of the memory apparatus of FIG. 1 illustrating a read operation, according to some embodiments.

FIG. 3 is a block diagram of the memory apparatus 100 of FIG. 1 illustrating a read operation, according to some embodiments. The read/write circuitry 118 of the target die 106 is configured to receive read data bits 302 from the data storage elements 116 (e.g., responsive to a read request received from the control circuitry 102). The read/write circuitry 118 is configured to provide the read data bits 302 to the error correction circuitry 110 and to a multiplexer 310. The error correction circuitry 110 is configured to generate and provide error correction information 304 computed based on the read data bits 302 to the multiplexer 310. In some embodiments, multiplexer 310 is configured to multiplex the read data bits 302 (e.g., two batches of eight bits) and the error correction information 304 one at a time to a latch 306, then to a buffer 308. By way of non-limiting example, the buffer 308 may include a first-in-first-out (FIFO) buffer (e.g., 18 bits deep: sixteen bits for the read data bits 302 and two bits for the error correction information 304).

Once the read data bits 302 and the error correction information 304 is received by the buffer 308, the clock circuitry 122 is configured to generate read ready signals RdRdy0, RdRdy1, and RdRdyCRC. The RdRdy0 signal, when clocked, is configured to shift a first half of the read data bits 302 to the master die 104 via the inter-die data connectors 124 (eight inter-die data connectors shown as a single line in FIG. 3). The RdRdy1 signal, when clocked, is configured to shift a second half of the read data bits 302 to the master data shift registers 112 via the inter-die data connectors 124. The RdRdyCRC signal, when clocked, is configured to shift the error correction information 304 to the master error shift registers 132 via the inter-die error correction connectors 126 (two inter-die data error correction connectors shown as a single line in FIG. 3).

The master die 104 is configured to receive the read data bits 302 and the error correction information 304 from the target die 106 and provide the read data bits 302 and the error correction information 304 to the control circuitry 102.

The error correction circuitry 108 of the control circuitry 102 is configured to receive the read data bits 302 and the error correction information 304 received from the master die 104. The error correction circuitry 108 is configured to generate new error correction information using the same function as the error correction circuitry 110 and the read data bits 302 received from the master die 104. If the new error correction information matches the error correction information 304, it may be determined that the read data bits 302 do not include errors and the read data bits 302 may assume that the read data bits 302 received from the master die 104 are correct. If, however, the new error correction information does not match the error correction information 304 received from the master die 104, it may be assumed that there are errors in the read data bits 302 received from the master die 104. Accordingly, the control circuitry 102 may request that the read operation be repeated until correct read data bits 302 are received.

Since the inter-die data connectors 124 used to carry write data bits 134 from the master die 104 to the target die 106 are the same inter-die data connectors 124 that carry the read data bits 302 from the target die 106 to the master die 104, data buffers (e.g., CMOS drivers) may be used to connect and isolate the inter-die data connectors 124 to various functional features of the master die 104 and the target die 106. For example, during a write operation buffers between the master data shift registers 112 and the inter-die data connectors 124 may be activated to enable bits on the master data shift registers 112 to be transmitted to the inter-die data connectors 124 and to the target die 106. Also, during the write operation buffers between the buffer 308 and the inter-die data connectors 124 may be disabled, electrically isolating the buffer 308 from the inter-die data connectors 124. During a read operation the buffers between the buffer 308 and the inter-die data connectors 124 may be activated to enable bits to be transmitted from the buffer 308 to the inter-die data connectors 124 and to the master die 104. Also, during the read operation the buffers between the master data shift registers 112 and the inter-die data connectors 124 may be disabled, electrically isolating the master data shift registers 112 from the inter-die data connectors 124.

Similarly, since the inter-die error correction connectors 126 used to carry error correction information 136 from the master die 104 to the target die 106 are the same inter-die error correction connectors 126 that carry the error correction information 304 from the target die 106 to the master die 104, data buffers (e.g., CMOS drivers) may be used to connect and isolate the inter-die error correction connectors 126 to various functional features of the master die 104 and the target die 106. For example, during a write operation buffers between the master error shift registers 132 and the inter-die error correction connectors 126 may be activated to enable bits on the master error shift registers 132 to be transmitted to the inter-die error correction connectors 126 and to the target die 106. Also, during the write operation buffers between the buffer 308 and the inter-die error correction connectors 126 may be disabled, electrically isolating the buffer 308 from the inter-die error correction connectors 126. During a read operation the buffers between the buffer 308 and the inter-die error correction connectors 126 may be activated to enable bits to be transmitted from the buffer 308 to the inter-die error correction connectors 126 and to the master die 104. Also, during the read operation the buffers between the master error shift registers 132 and the inter-die error correction connectors 126 may be disabled, electrically isolating the master error shift registers 132 from the inter-die error correction connectors 126. Further, in instances where the master die 104 is transmitting or receiving bits via the inter-die data connectors 124 and/or the inter-die error connection connectors 126 to a different target die (not shown) than the target die 106, the buffers between the buffer 308 and the inter-die data connectors 124 and between the buffer 308 and the inter-die error correction connectors 126 may be disabled to electrically isolate the buffer 308 from the inter-die data connectors 124 and the inter-die error correction connectors 126.

Figure 4:
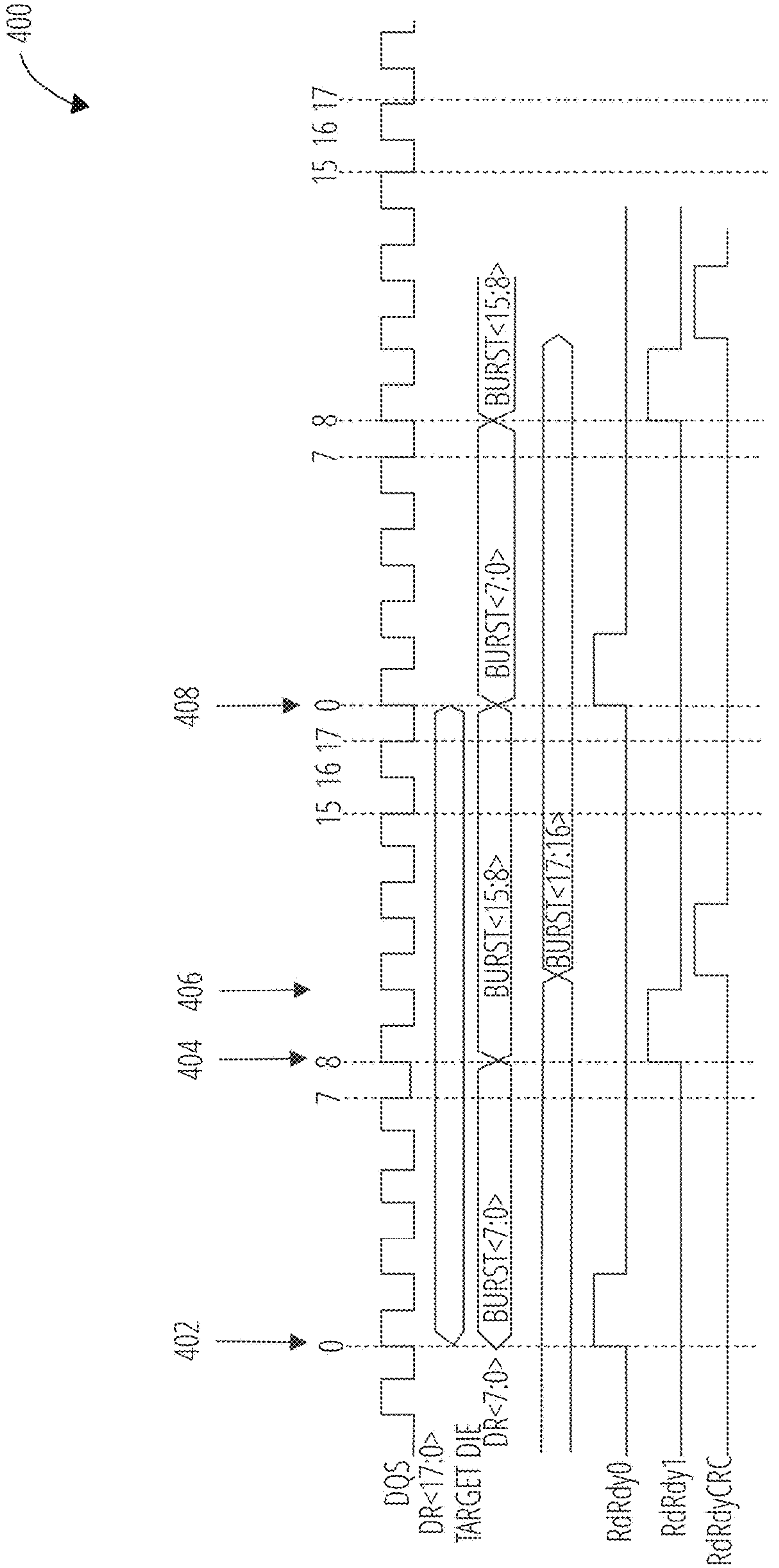
FIG. 4 is a signal timing diagram illustrating signals relevant to a read operation of the memory apparatus of FIG. 1, according to some embodiments.

FIG. 4 is a signal timing diagram 400 illustrating signals relevant to a read operation of the memory apparatus 100 of FIG. 1, according to some embodiments. Referring to FIG. 3 and FIG. 4 together, the signal timing diagram 400 includes examples of the DQS signal, a DR signal, the RdRdy0 signal, the RdRdy1 signal, and the RdRdyCRC signal of FIG. 1 and FIG. 3. As previously discussed, the buffer 308 is configured to store a first half (BURST<7:0>) and a second half (BURST<15:8>) of the read data bits 302 thereon. At time 402 (0 clock edges of DQS) a first half (BURST<7:0> of the DR signal) of the read data bits 302 is provided to the inter-die data connectors 124, and the master die 104 may begin to the first half of the data bits 302 from the inter-die data connectors 124 responsive to a cycling of the RdRdy0 signal. At time 404 (8 clock edges of DQS) a second half (BURST<15:8>) of the read data bits 302 is provided to the inter-die data connectors 124, and the master die 104 may begin to read the second half of the data bits 302 from the inter-die data connectors 124 responsive to a cycling of the RdRdy1 signal. At time 406 the error correction information 304 (BURST<17:16>) is provided to the inter-die error correction connectors 126 responsive to a cycling of the RdRdyCRC signal, and the master die 104 may begin to read the error correction information from the inter-die error correction connectors 126. Starting at time 408 the next sixteen bit read data and its corresponding error correction information may be transmitted from the target die 106 to the master die 104.

In some embodiments, the target die 106 is configured to provide the read data bits 302 to the master die 104 via the inter-die data connectors 124 in two bursts of eight read data bits 302 for every nine clock cycles of clock DQ, as illustrated in FIG. 4. Also, in some embodiments, the target die 106 is further configured to provide the error correction information 304 to the master die 104 via the inter-die error correction connectors 126 in a single burst of two bits of the error correction information 304 for every nine cycles of clock DQ.

Figure 5:
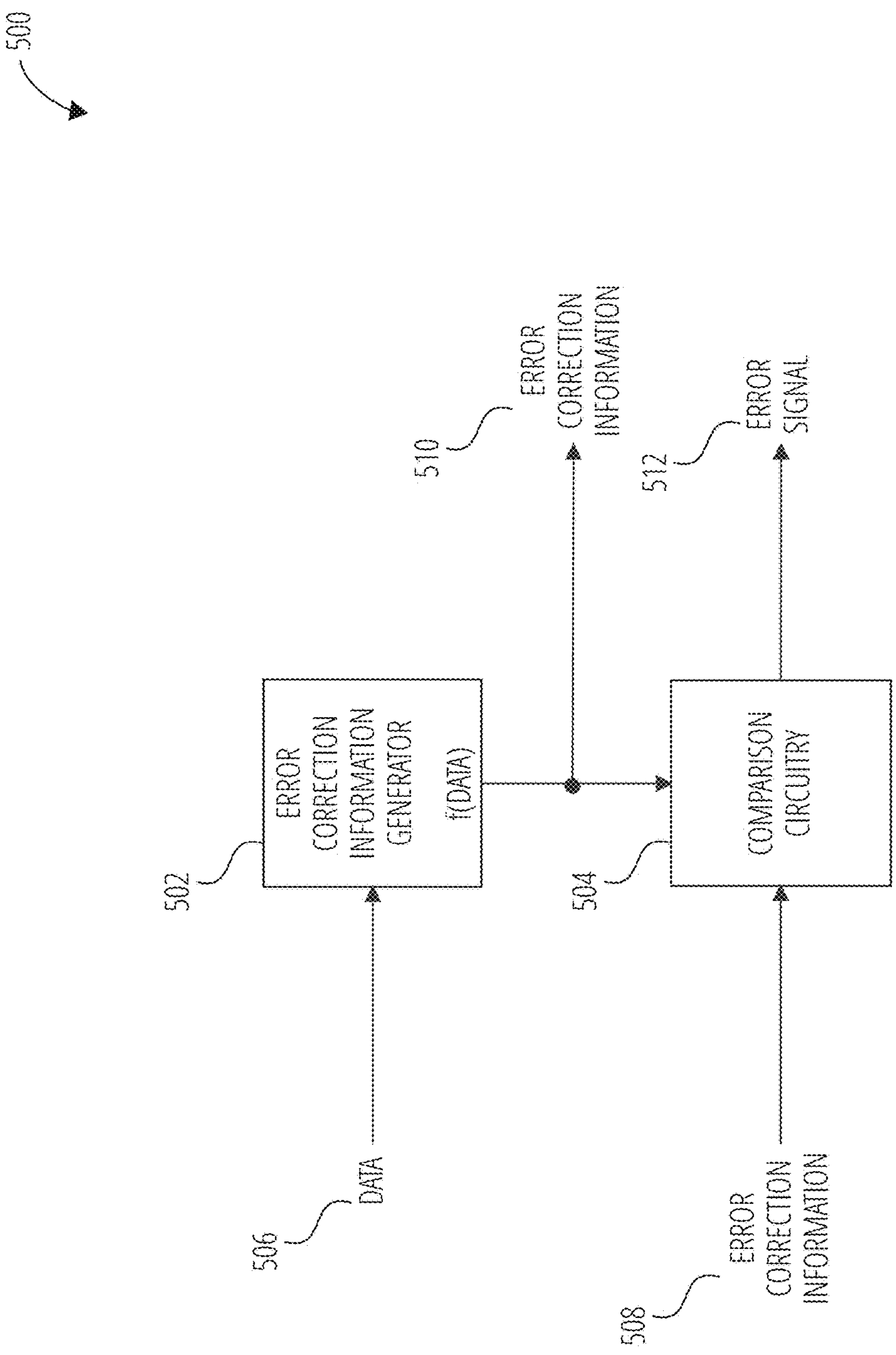
FIG. 5 is a block diagram of error correction circuitry, according to some embodiments.

FIG. 5 is a block diagram of error correction circuitry 500, according to some embodiments. In some embodiments, the error correction circuitry 108, the error correction circuitry 110, or both the error correction circuitry 108 and the error correction circuitry 110 may include the error correction circuitry 500 of FIG. 5. The error correction circuitry 500 includes an error correction information generator 502 and comparison circuitry 504. The error correction information generator 502 is configured to receive data 506 (e.g., the write data bits 134 of FIG. 1, the read data bits 302 of FIG. 3) and use a function f(DATA) to compute error correction information 510 (e.g., the error correction information 136 of FIG. 1, the error correction information 304 of FIG. 3) based on the data 506. By way of non-limiting example, the error correction information generator 502 may include CRC circuitry configured to generate CRC bits, in which case the error correction information 510 includes CRC bits. The error correction information generator 502 is configured to provide the error correction information 510.

In some instances, the error correction circuitry 500 may receive, from an external source, error correction information 508 that is to be compared to the error correction information 510 generated by the error correction information generator 502. In such instances the comparison circuitry 504 is configured to compare the error correction information 510 to the error correction information 508 and generate an error signal 512 responsive to the error correction information 510 and the error correction information 508 being different. By way of non-limiting example, in the memory apparatus 100 of FIG. 1 the error correction circuitry 110 of the target die 106 may receive the write data bits 134 and the error correction information 136. As previously discussed, the error correction information 136 was generated by the error correction circuitry 108 of the control circuitry 102. In this example the error correction information 136 may be the error correction information 508 and the write data bits 134 may be the data 506. The comparison circuitry 504 of the error correction circuitry 110 may compare the error correction information 136 (which is the error correction information 508 in this example) to the error correction information 510 generated by its own error correction information generator 502 responsive to the write data bits 134 (which are the data 506 in this example). Also by way of non-limiting example, in the memory apparatus 100 of FIG. 3, the error correction circuitry 108 of the control circuitry 102 may receive the error correction information 304 and the read data bits 302. As previously discussed, the error correction information 304 was generated by the error correction circuitry 110 of the target die 106. In this example the error correction information 304 may be the error correction information 508 and the read data bits 302 may be the data 506. The comparison circuitry 504 of the error correction circuitry 108 may compare the error correction information 304 (which is the error correction information 508 in this example) to error correction information 510 generated by its own error correction information generator 502 responsive to the read data bits 302 (which are the data 506 in this example).

In some instances, the error correction circuitry 500 may not receive the error correction information 508 from an outside source. In such embodiments, the error correction information 510 may be provided without the comparison circuitry 504 comparing the error correction information 510 to the error correction information 508. By way of non-limiting example, in the memory apparatus 100 of FIG. 1 the error correction circuitry 108 of the control circuitry 102 receives the write data bits 134 (which are the data 506 in this example), and the error correction information generator 502 of the error correction circuitry 108 generates the error correction information 136 (which is the error correction information 510 in this example) to enable the target die 106 to check for errors in write data bits 134 received from the master die 104. Also by way of non-limiting example, in the memory apparatus 100 of FIG. 3 the error correction circuitry 110 of the target die 106 receives the read data bits 302 (which are the data 506 in this example), and the error correction information generator 502 of the error correction circuitry 110 generates the error correction information 304 (which is the error correction information 510 in this example) to enable the control circuitry 102 to check for errors in the read data bits 302 received from the master die 104.

Figure 6:
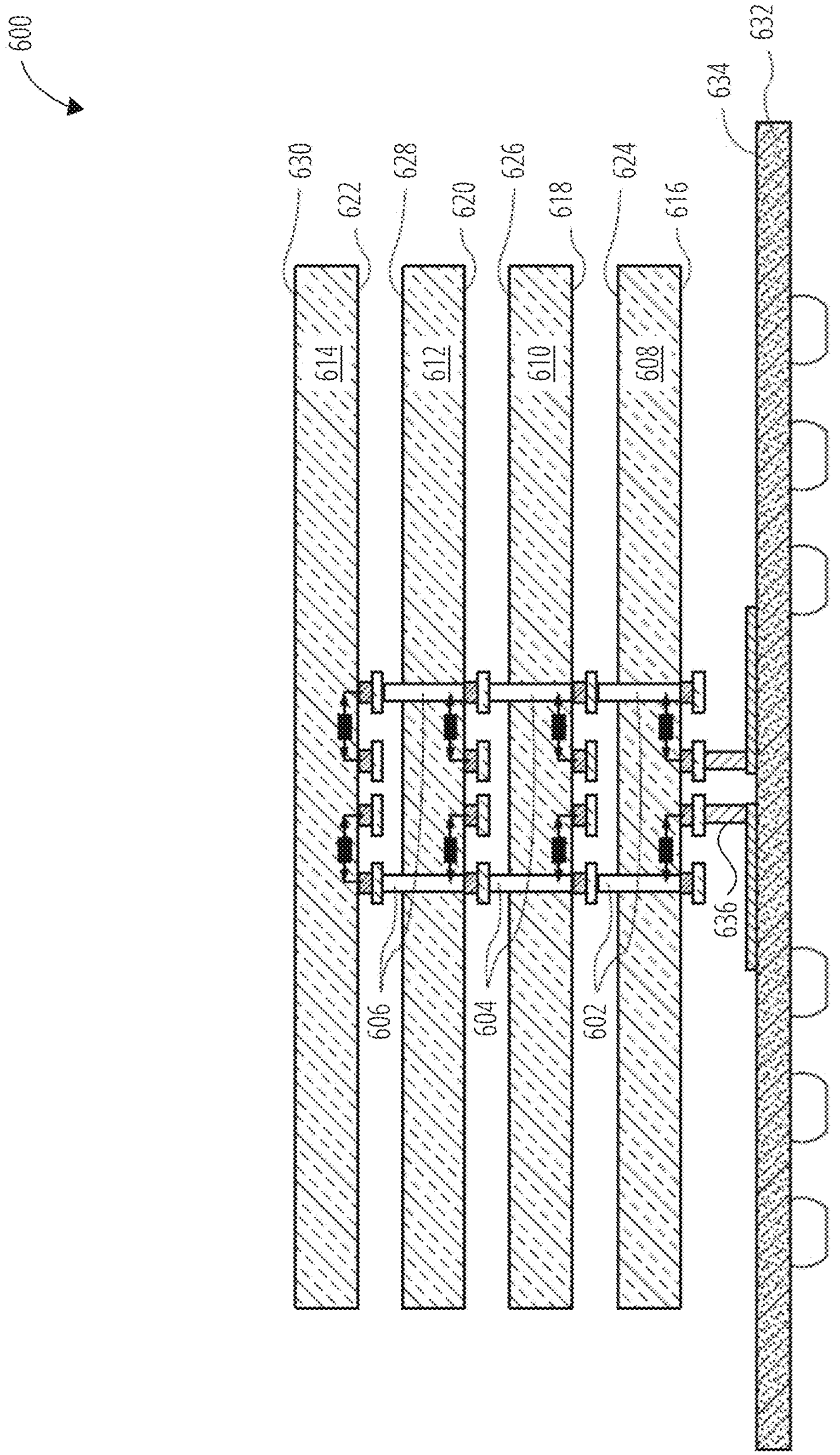
FIG. 6 is a cross-sectional view of a stacked die package including through silicon vias (TSVs), according to some embodiments.

FIG. 6 is a cross-sectional view of a stacked die package 600 including through silicon vias (TSVs), according to some embodiments. Stacked die package 600 includes a plurality of vertically stacked die. The term "die" provided herein may refer to a single die or may refer to a plurality of die (e.g., dice or dies). Stacked die package 600 includes semiconductor die 608 (also referred to as a "bottom die" in stacked die package 600), semiconductor die 610, semiconductor die 612 and semiconductor die 614 (also referred to as a "top die" in stacked die package 600). In some embodiments, the semiconductor die 608 may be a master die such as the master die 104 of FIG. 1 and the semiconductor die 610, the semiconductor die 612, and the semiconductor die 614 may include target dies such as the target die 106 of FIG. 1. In such embodiments, the semiconductor die 608, which serves as the master die, may serve as a communication interface between the target dies and control circuitry such as the control circuitry 102 of FIG. 1. Accordingly, the stacked die package 600 may be configured to perform write operations and read operations, as discussed above with reference to FIG. 1, FIG. 2, FIG. 3, and FIG. 4.

The semiconductor die 608 may be configured to communicate with the control circuitry 102 through conductive features 636 between the semiconductor die 608 and the substrate 632. In some embodiments, the substrate 632 includes the control circuitry 102. In some embodiments, the substrate 632 is electrically connected to the control circuitry 102.

In some embodiments, each of the semiconductor die are oriented in a similar orientation (e.g., in a "face down" orientation, with active surfaces facing downwardly toward substrate 632). For example, back side surface 624 of semiconductor die 608, back side surface 626 of semiconductor die 610, back side surface 628 of semiconductor die 612 and back side surface 630 of semiconductor die 614' each face the same vertical direction. More specifically, upper surface 634 of substrate 632 faces active surface 616 of semiconductor die 608, active surface 618 of semiconductor die 610 faces back side surface 624 of semiconductor die 608, active surface 620 of semiconductor die 612 faces back side surface 626 of semiconductor die 610 and active surface 622 of semiconductor die 614 faces back side surface 628 of semiconductor die 612.

Each of the semiconductor die are mutually operably coupled by TSVs. Accordingly, to the extent that the stacked die package 600 embodies the memory apparatus 100 of FIG. 1 and FIG. 3, the inter-die data connectors 124, the inter-die error correction connectors 126, and the inter-die clock connectors 128 may include TSVs. A TSV is a vertical electrical connection (e.g., via) that is dielectrically isolated from, and passes completely through, a silicon wafer or die. In stacked die package 600, semiconductor die 608 is operably coupled to semiconductor die 610 via TSVs 602. Semiconductor die 610 is operably coupled to semiconductor die 612 via TSVs 604. Semiconductor die 612 is operably coupled to semiconductor die 614 via TSVs 606. Accordingly, signals transmitted to stacked die package 600 (from external circuitry) are received through substrate 632 and transmitted to one or more die via respective TSVs. Similarly, signals transmitted from stacked die package 600 are transmitted from one or more die via respective TSVs and through substrate 632 (to external circuitry).

By way of non-limiting example, the stacked die package 600 may include a DRAM die. Stacked die package 600 may comprise a DDR5 SDRAM device. The stacking of die in stacked die package 600 may be referred to as a three-dimensional stacking (or "3DS"), where the vertical direction (of the stacked die) is along a Z-axis, and the length and width of the respective die are along an X-axis and a Y-axis, respectively.

Figure 7:
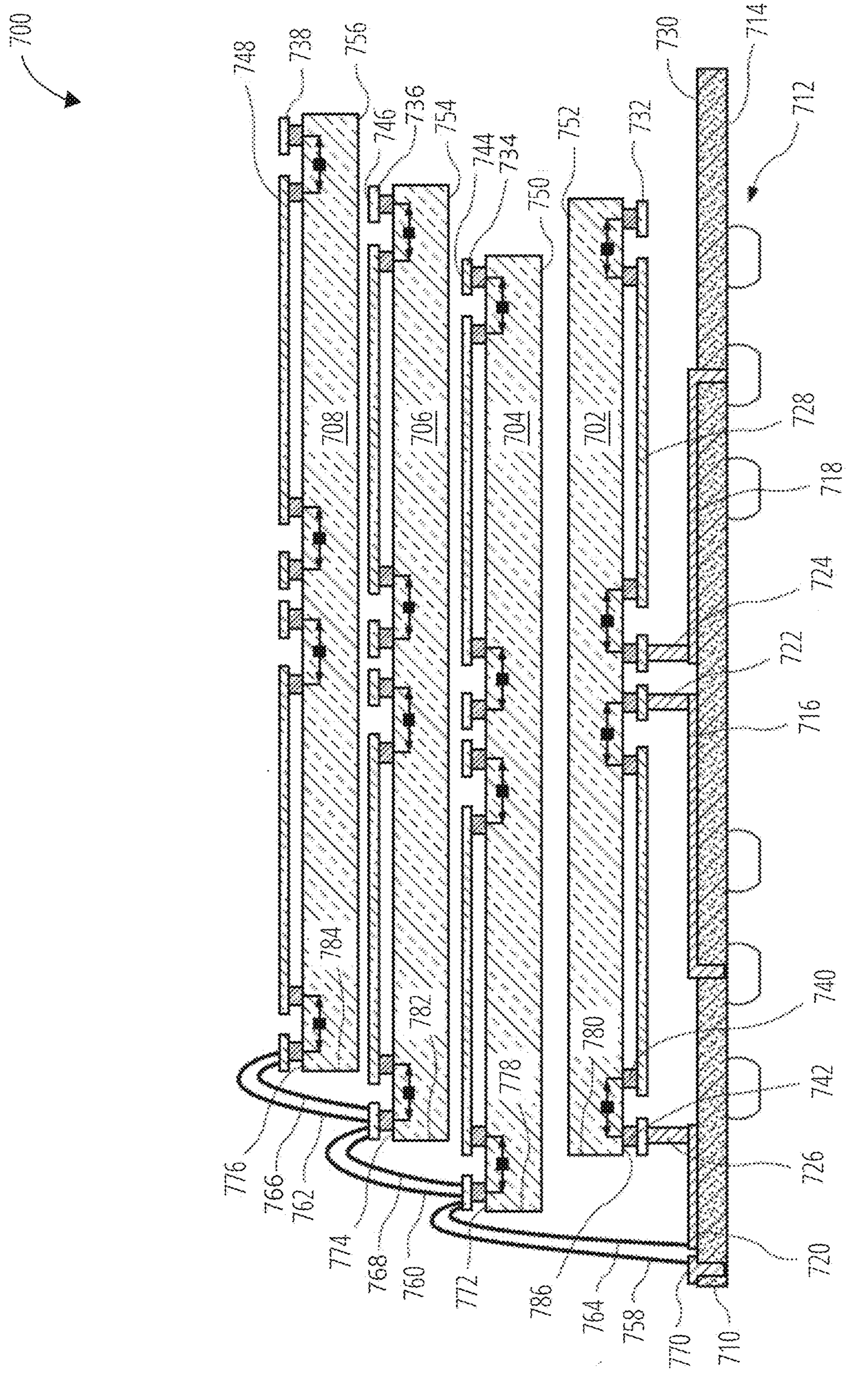
FIG. 7 is a cross-sectional view of a stacked die package including wire bond features, according to various embodiments of the present disclosure.

FIG. 7 is a cross-sectional view of a stacked die package 700 including wire bond features, according to various embodiments of the present disclosure. Stacked die package 700 comprises a plurality of vertically stacked semiconductor die. For example, stacked die package 700 includes semiconductor die 702, semiconductor die 704, semiconductor die 706 and semiconductor die 708 that are vertically stacked with respect to one another. In some embodiments, the semiconductor die 702 may be a master die such as the master die 104 of FIG. 1 and the semiconductor die 704, the semiconductor die 706, and the semiconductor die 708 may include target dies such as the target die 106 of FIG. 1. In such embodiments, the semiconductor die 702, which serves as the master die, may serve as a communication interface between the target dies and control circuitry such as the control circuitry 102 of FIG. 1. Accordingly, the stacked die package 700 may be configured to perform write operations and read operations, as discussed above with reference to FIG. 1, FIG. 2, FIG. 3, and FIG. 4.

The semiconductor die 702 may be configured to communicate with the control circuitry 102 through conductive features (e.g., via 742, iRDL 732, DCA feature 722, DCA feature 724, DCA feature 726, and interconnects 716, interconnects 718, interconnects 720) between the semiconductor die 702 and the substrate 710. In some embodiments, the substrate 710 includes the control circuitry 102. In some embodiments, the substrate 710 is electrically connected to the control circuitry 102 (e.g., through interconnects 712).

By way of non-limiting example, the stacked die package 700 may include a DRAM die. Stacked die package 700 may comprise a DDR5 SDRAM device. The stacking of die in stacked die package 700 may be referred to as a three-dimensional stacking (or "3DS"), where the vertical direction (of the stacked die) is along a Z-axis, and the length and width of the respective die are along an X-axis and a Y-axis, respectively.

One or more of the die (semiconductor die 702, semiconductor die 704, semiconductor die 706, semiconductor die 708) may be a same type of die (e.g., DRAM die) or may be different types of die, for example, bottom semiconductor die 702 may be a logic die. One or more of the die may have the same dimensions (e.g., same height, width, length) or may have different dimensions. Stacked die package 700, as depicted, includes four stacked semiconductor die. However, stacked die package 700 may include more or less than four stacked semiconductor die.

Stacked die package 700, in various embodiments, employs a master/slave relationship between the stacked die. That is, one die is configured as a master die (e.g., semiconductor die 702) and the remaining die (e.g., semiconductor die 704, semiconductor die 706, and semiconductor die 708) in the stack are configured as slave or target device(s). Each die may function as a different logical rank. In various embodiments, the master die is the only die that interfaces with external circuitry such as a memory controller. Additionally, because the master die provides isolation (or buffering) to the slave die, the electrical signal loading of the external interface is that of a single die (e.g., a single DDR5 SDRAM), which can improve timing, bus speeds, and/or signal integrity while lowering power consumption.

Stacked die package 700 includes substrate 710 that supports the vertically stacked die. Substrate 710 includes interconnects 712 coupled to back side surface 714 of substrate 710. Interconnects 712 may include solder balls, or any other structure suitable for electrically coupling stacked die package 700 with circuitry external of the package (e.g., memory controller circuitry).

Substrate 710 includes interconnects 716, interconnects 718 and interconnects 720. Such interconnects can be, but are not limited to, traces and/or vias. Interconnects 716 and interconnects 718 are electrically coupled to interconnects 712. Interconnects 716 and interconnects 718 are coupled to direct chip attachment (DCA) features, DCA feature 722 and DCA feature 724 (also referred to as DCA interconnects), respectively. As a result, semiconductor die 702 is coupled to interconnects 716 and interconnects 718 of substrate 710 via DCA feature 722 and DCA feature 724, respectively. The term "DCA" refers to directly attaching an integrated circuit (chip or die) to a component such as a substrate or printed circuit board. DCA eliminates the cost of separately packaging the integrated circuit into a carrier before attaching the carrier to another component. DCA feature 722, DCA feature 724, and DCA feature 726, in various embodiments, may include DCA pillars, such as copper pillars, which may (for example) extend between a die and terminal pads of a substrate.

Interconnects 720 of substrate 710 are electrically coupled to DCA feature 726 (also referred to as DCA interconnects). As a result, semiconductor die 708 is coupled to interconnects 720 of substrate 710 via DCA feature 726. Moreover, as will be described in further detail below, semiconductor die 702 is electrically coupled to semiconductor die 704, semiconductor die 706, and semiconductor die 708 via interconnects 720 and DCA feature 726.

It should be appreciated that DCA feature 722, DCA feature 724, and DCA feature 726, in various embodiments, may be configured as respective rows of DCA features perpendicular to the plane of the drawing sheet. As such, a first DCA feature of respective rows of DCA feature 722, DCA feature 724, and DCA feature 726 are depicted in FIG. 7 and the other DCA features in the respective rows of DCA features are not shown. In various embodiments, DCA feature 722 include a row of, for example, 70 DCA pillars (along a center portion of active surface 728 of semiconductor die 708 and upper surface 730 of substrate 710) and DCA feature 724 include a row of, for example, 70 DCA pillars (along a center portion of active surface 728 of semiconductor die 708 and upper surface 730 of substrate 710).

In various embodiments, one or more of semiconductor die 702, semiconductor die 704, semiconductor die 706, and semiconductor die 708 may include an inline redistribution layer (iRDL). For example, semiconductor die 702 includes iRDL 732, semiconductor die 704 includes iRDL 734, semiconductor die 706 includes iRDL 736 and semiconductor die 708 includes iRDL 738.

An iRDL, in various embodiments, is a redistribution layer that may be the lowest resistivity layer in the die. Additionally, an iRDL includes low resistivity lines that provide power to certain locations within the device (or die). The iRDL may be formed in a semiconductor fabrication process that occurs before semiconductor die are assembled in a stack. In some cases, an iRDL layer may include a metal 4 (M4) layer over a metal 3 (M3) layer. For power to be transferred from the iRDL layer to lower layers of a die, the die may include one or more vias. A die may include one or more "iRDL vias" that provide conductive pathways between power distribution lines in the iRDL layer ("iRDL lines") to wiring that is located in an underlying metal layer. In one example, an iRDL (e.g., iRDL 732) includes vias (e.g., via 740 and via 742 that may be, for example, proximate to a lateral end 786 of semiconductor die 702) that provide a conductive pathway between an M4 layer and an M3 layer. The die may also include additional vias that provide conductive pathways between other layers, such as M3-M2 vias.

An iRDL layer may be an uppermost layer of a die, over the active surface. For example, a top of active surface 728 of semiconductor die 702 is an outermost surface of iRDL 732. Similarly, a top of active surface 744 of semiconductor die 704 is an outermost surface of iRDL 734, a top of active surface 746 of semiconductor die 706 is an outermost surface of iRDL 736 and a top of active surface 748 of semiconductor die 708 is an outermost surface of iRDL 738.

In some embodiments, semiconductor die 702 is "face down" with respect to substrate 710. That is, active surface 728 of semiconductor die 702 faces upper surface 730 of substrate 710. However, semiconductor die 704, semiconductor die 706, and semiconductor die 708 are positioned in an opposite orientation than semiconductor die 702. That is, semiconductor die 704, semiconductor die 706, and semiconductor die 708 are positioned "face up" with respect to substrate 710, with their active surface 744, active surface 746, and active surface 748 facing away from substrate 710. For example, back side surface 750 of semiconductor die 704 faces back side surface 752 of semiconductor die 702, back side surface 754 of semiconductor die 706 faces active surface 744 of semiconductor die 704 and back side surface 756 of semiconductor die 708 faces active surface 746 of semiconductor die 706.

Semiconductor die 704, semiconductor die 706, and semiconductor die 708 are electrically coupled to substrate 710 via wire bonding, an interconnection technique used for electrically connecting microelectronic devices (e.g., semiconductor dice) to the terminals of a chip package or directly to a terminals on a substrate. Accordingly, to the extent that the stacked die package 600 embodies the memory apparatus 100 of FIG. 1 and FIG. 3, the inter-die data connectors 124, the inter-die error correction connectors 126, and the inter-die clock connectors 128 may include wire bonding features (wires).

Semiconductor die 704 is electrically coupled to interconnects 720 (e.g., traces) of substrate 710 via two sets (or rows) of wires, such as wires 758 and wires 764. In at least one embodiment, wires 758 may include a first row of, for example, 100 wires and wires 764 may include a second row of, for example, 100 wires, the rows of wires being perpendicular to the plane of the drawing sheet. Wires 758 and wires 764 are bonded proximate to (1) lateral end 770 of upper surface 730 of substrate 710 at rows of wire bond features and (2) lateral end 772 of active surface 744 of semiconductor die 704.

Semiconductor die 706 is electrically coupled to semiconductor die 704 via two sets (or rows) of wires, such as wires 768 and wires 760. In at least one embodiment, wires 760 may include a first row of, for example, 100 wires and wires 768 may include a second row of, for example, 100 wires. Wires 760 and wires 768 are bonded proximate to (1) lateral end 772 of active surface 744 of semiconductor die 704 and (2) lateral end 774 of active surface 746 of semiconductor die 706. Semiconductor die 706 is electrically coupled to substrate 710 via wires 760 and wires 768, and wires 758/wires 764.

Semiconductor die 708 is electrically coupled to semiconductor die 706 via two sets (or rows) of wires, such as wires 762 and wires 766. In one embodiment, wires 762 are a first row of 100 wires and wires 766 are a second row of 100 wires. Wires 762 and wires 766 are bonded proximate to (1) lateral end 774 of active surface 746 of semiconductor die 706 and (2) lateral end 776 of active surface 748 of semiconductor die 708. Semiconductor die 708 is electrically coupled to substrate 710 via wires 766 and wires 762, wires 768 and wires 760, and wires 764 and wires 758.

In some embodiments, semiconductor die 702, semiconductor die 704, semiconductor die 706, and semiconductor die 708 are laterally offset from one another. For example, lateral side 778 of semiconductor die 704 is laterally offset from lateral side 780 of semiconductor die 702 in a first lateral direction. Lateral side 782 of semiconductor die 706 is laterally offset from lateral side 778 of semiconductor die 704 in an opposite second lateral direction. Lateral side 784 of semiconductor die 708 is laterally offset from lateral side 782 in the second direction. The laterally offset lateral sides of semiconductor die 702, and the "shingle stack" offset arrangement of semiconductor die 704, semiconductor die 706, and semiconductor die 708 provides for, among other things, an area for wire bonding to pads on respective active surfaces of semiconductor die 704, semiconductor die 706, and semiconductor die 708.

Semiconductor die 704, semiconductor die 706, and semiconductor die 708 (that are electrically coupled to one another and to substrate 710 via wire bonding) are electrically coupled to semiconductor die 702 via interconnects 720 of substrate 710 and DCA feature 726. As such, internal signals (e.g., power signals, read/write signals, etc.) transmitted between semiconductor die 702 and any one of semiconductor die 704, semiconductor die 706, and semiconductor die 708 are transmitted via substrate 710 (i.e., via interconnects 720 of substrate 710). The term "via substrate" as provided herein refers to signals transmitted between semiconductor die 702 and any one of semiconductor die 704, semiconductor die 706, and semiconductor die 708 are transmitted along a conductive path of substrate 710. One example of a conductive path is interconnects 720 (e.g., traces and/or vias).

More specifically, external signals (e.g., command signals, address signals, data signals, power signals, and the like) are received at semiconductor die 702 (from external circuitry) via DCA feature 722 and DCA feature 724. The external signals are decoded into internal signals via one or more decoders (e.g., address decoder 802 of FIG. 8). In at least one embodiment, external signals received by semiconductor die 702 include, for example, 52 signals and 90 power signals that are decoded into, for example, 128 internal signals and 68 internal power signals (that are subsequently transmitted to one or more of semiconductor die 704, semiconductor die 706, and semiconductor die 708).

The internal signals are transmitted along iRDL 732 of semiconductor die 702 to interconnects 720 of substrate 710 via DCA feature 726. The internal signals are then transmitted to one or more slave die (e.g., semiconductor die 704, semiconductor die 706, and semiconductor die 708) via respective wire bonding between the slave die and substrate 710. Likewise, internal signals transmitted to semiconductor die 702 from one or more of semiconductor die 704, semiconductor die 706, and semiconductor die 708 are transmitted via respective wire bonding to interconnects 720 of substrate 710. The internal signals are then transmitted along iRDL 732 of semiconductor die 702 to interconnects of substrate 710 via one or more DCA features (e.g., DCA feature 722 and DCA feature 724). The signals are then transmitted to external circuitry from the interconnects of the substrate 710 via interconnects 712.

Additionally, stacked die package 700, as described herein, eliminates the use of TSVs. As such, stacked die package 700 implements various features such as iRDL on the stacked dies and DCA features and wire bonding to interconnect the stacked dies and substrate. By eliminating TSVs, the array efficiency of the stacked dies increases (e.g., ~2.35% increase) with respect to stacked die package 600 of FIG. 6, the chip/die size is decreased (e.g., ~4.7% decrease) with respect to stacked die package 600, and power consumption is reduced (e.g., ~12% reduction) with respect to stacked die package 600.

Figure 8:
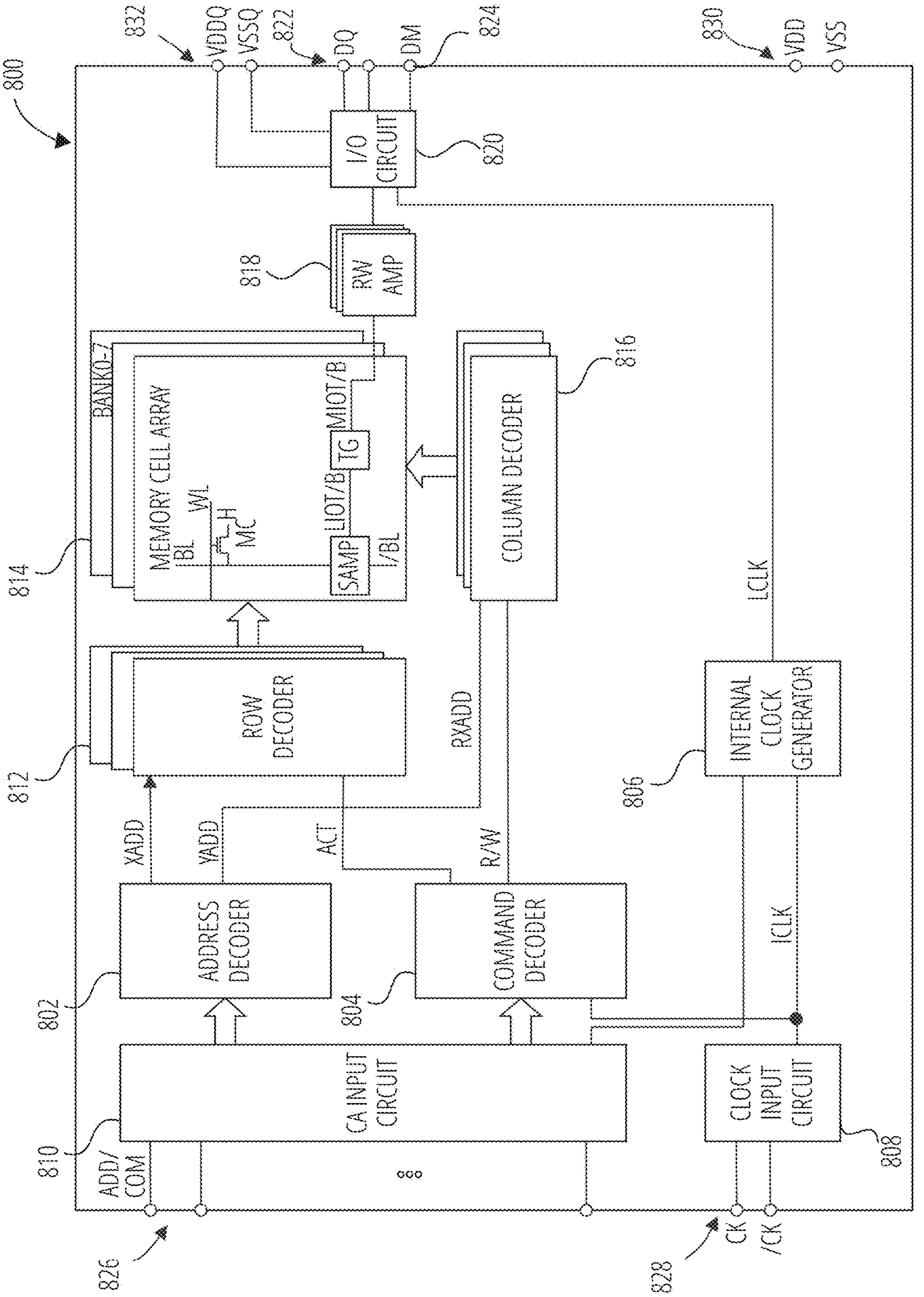
FIG. 8 illustrates a memory device, according to various embodiments of the present disclosure.

FIG. 8 illustrates a memory device 800, according to various embodiments of the present disclosure. Memory device 800, which may include, for example, a DRAM (dynamic random-access memory), a SRAM (static random-access memory), a SDRAM (synchronous dynamic random-access memory), a DDR SDRAM (double data rate DRAM, such as a DDR4 or DDR5 SDRAM and the like), or a SGRAM (synchronous graphics random-access memory), may be part of a memory system. Memory device 800, which may be integrated on a semiconductor chip, may include a memory cell array 814.

The memory device 800 may include a stack of multiple die. For example, the memory device 800 may include a master die (e.g., the master die 104 of FIG. 1 and FIG. 3) and one or more target die (e.g., the target die 106 of FIG. 1 and FIG. 3). In the embodiment of FIG. 8, memory cell array 814 is shown as including eight memory banks BANK0-7. More or fewer banks may be included in memory cell array 814 of other embodiments. Each memory bank of the array that corresponds to a target die (e.g., the target die 106) may include error correction circuitry (e.g., the error correction circuitry 500 of FIG. 5 such as the error correction circuitry 110 of FIG. 1). Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 812 and the selection of the bit lines BL and/BL may be performed by a column decoder 816. In the embodiment of FIG. 8, row decoder 812 may include a respective row decoder for each memory bank BANK0-7, and column decoder 816 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 818 over complementary local data lines (LIOT/B), transfer gate (TG), and complementary main data lines (MIOT/B). Conversely, write data outputted from read/write amplifiers 818 may be transferred to sense amplifier SAMP over complementary main data lines MIOT/B, transfer gate TG, and complementary local data lines LIOT/B, and written in memory cell MC coupled to bit line BL or/BL.

Memory device 800 may be generally configured to be receive various inputs (e.g., from an external controller) via various terminals, such as address/command terminals 826 (e.g., ADD/COM), clock terminals 828 (e.g., CK,/CK), data terminals 822 (e.g., DQ), and data mask terminals 824 (e.g., DM). Memory device 800 may include additional terminals such as power supply terminals 830 (e.g., VDD, VSS) and power supply terminals 832 (e.g., VDDQ, VSSQ).

During a contemplated operation, one or more command signals COM, received via address/command terminals 826, may be conveyed to a command decoder 804 via a CA input circuit 810. Command decoder 804 may include a circuit configured to generate various internal commands via decoding one or more command signals COM. Examples of the internal commands include an active signal ACT and a read/write signal R/W.

Further, one or more address signals ADD, received via address/command terminals 826, may be conveyed to an address decoder 802 via the CA input circuit 810. Address decoder 802 may be configured to supply a row address XADD to row decoder 812 and a column address YADD to column decoder 816.

Active signal ACT may include a pulse signal that is activated in response to a command signal COM indicating row access (e.g., an active command). In response to active signal ACT, a row decoder 812 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 816 may be activated, and the bit line BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifiers 818, an input/output circuit 820, and data terminals 822. Further, in response to active signal ACT, a write signal, a row address XADD, and a column address YADD, write data may be supplied to memory cell array 814 via data terminals 822, input/output circuit 820, read/write amplifiers 818, transfer gate TG, and sense amplifier SAMP. The write data may be written to memory cell MC specified by row address XADD and column address YADD.

Clock signals CK and/CK may be received via clock terminals 828. A clock input circuit 808 may generate internal clock signals ICLK based on clock signals CK and/CK. Internal clock signals ICLK may be conveyed to various components of memory device 800, such as command decoder 804 and an internal clock generator 806. Internal clock generator 806 may generate internal clock signals LCLK, which may be conveyed to input/output circuit 820 (e.g., for controlling the operation timing of input/output circuit 820). Further, data mask terminals 824 may receive one or more data mask signals DM. When data mask signal DM is activated, overwrite of corresponding data may be prohibited.

In some embodiments, a whole structure including master/slave dies is equal to one planar chip at a point of its function as DRAM. The terms "target die" and "slave die" may be used herein interchangeably. The master die works as an interface to the target dies. For example, the master die may decode commands in a command decoder 804, and the decoded signals (internal signals) may be transferred from the master die to target dies. Error correction code (e.g., "CRC code") may be generated in an encoding circuit responsive to corresponding data (for instance, in a HOST), and the code may be sent to the DRAM together with the corresponding data. As previously discussed, the error correction circuitry may determine whether there are error bits in the corresponding data responsive to the code and the corresponding data.

Figure 9:
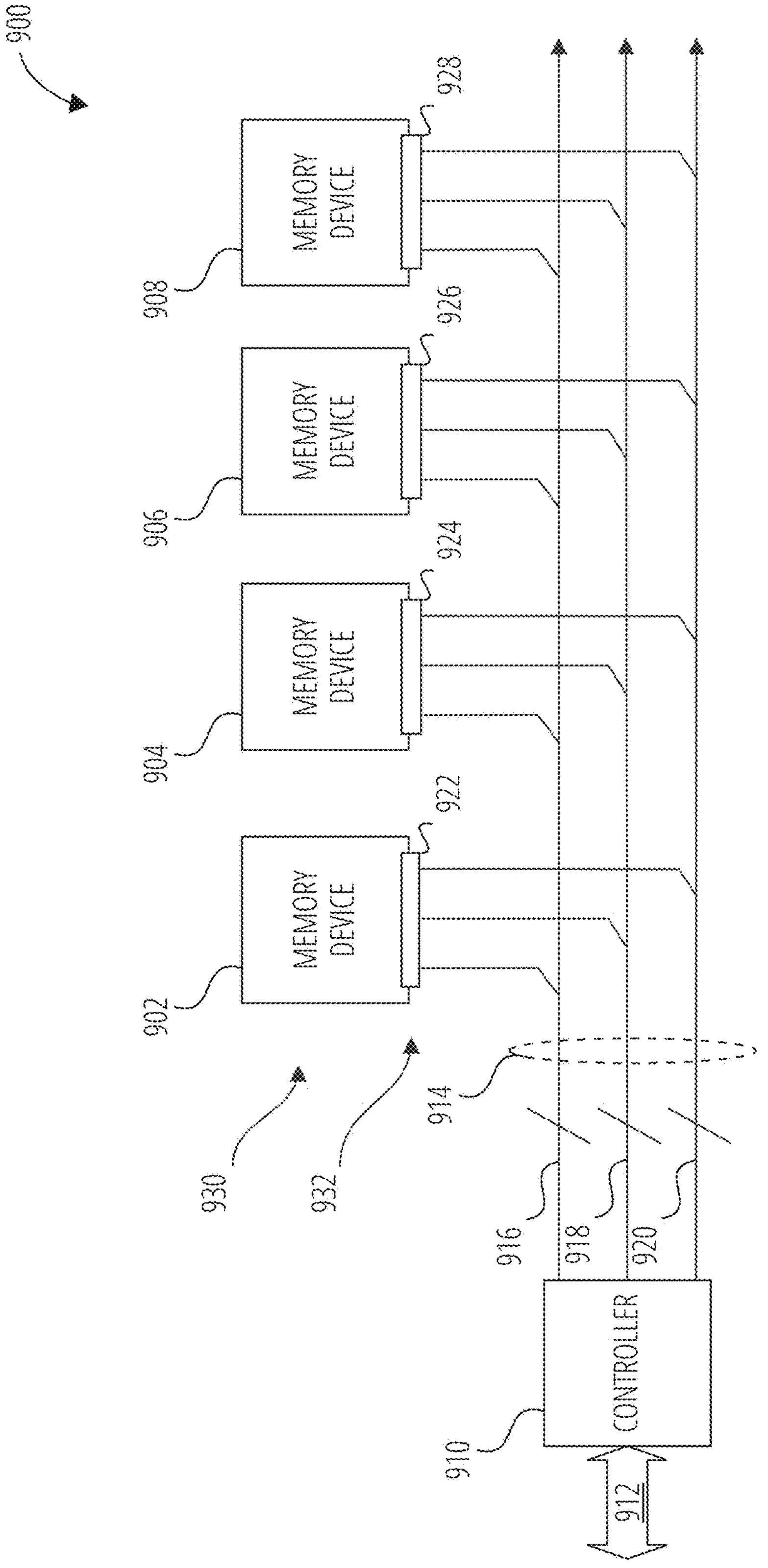
FIG. 9 is a block diagram of a memory system including the memory apparatus of FIG. 1 and FIG. 3, according to some embodiments.

FIG. 9 is a block diagram of a memory system 900 including the memory apparatus 100 of FIG. 1 and FIG. 3, according to some embodiments. The memory system 900 includes a number of memory devices 930 (e.g., memory device 902, memory device 904, memory device 906, and memory device 908) operably coupled to a communication bus 914. At least one of the memory devices 930 may include a master die (e.g., the control circuitry 102 of FIG. 1 and FIG. 3) and one or more target die (e.g., the target die 106 of FIG. 1 and FIG. 3), and may include the memory device 800 of FIG. 8. Collectively, the memory devices 930 may be referred to as a memory module (e.g., a dual in-line memory module (DIMM)), a multi-chip package (MCP) or a package on package (POP).

Memory system 900 further includes a controller 910 (e.g., including the control circuitry 102 of FIG. 1 and FIG. 3) coupled to each of the memory devices 930 via communication bus 914. Controller 910, which may include a processor or any other suitable type of controller, may be configured to control and/or regulate various operations of memory system 900, as well as provide interactivity with another device or system coupled to memory system 900 via an interface 912.

Communication bus 914 may include one or more of an address bus 916 (e.g., operably coupled to address/command terminals 826 of FIG. 8), a data bus 918 (e.g., operably coupled to data terminals 822 of FIG. 8), and a control signal bus 920 (e.g., operably coupled to address/command terminals 826 of FIG. 8). In some embodiments, the memory devices 930, communication bus 914, and controller 910 may be configured (e.g., physically arranged and mounted) on a printed circuit board (PCB). In various embodiments, memory system 900 may include a DIMM and one or more of the memory devices 930 may be a rank (or a number of ranks) of the DIMM.

According to some embodiments of the present disclosure, at least some of memory devices 930 may be coupled to communication bus 914 via an associated interface 932 (e.g., interface 922, interface 924, interface 926, and interface 928). For example, interface 932 (any one of interface 922, interface 924, interface 926, and interface 928) may include one or more nodes (e.g., input/output (I/O) nodes) for coupling signal lines of an associated one of the memory devices 930 to respective signal lines of communication bus 914. Further, interface 932 may include one or more nodes coupled to one or more power supplies (not shown in FIG. 9), such as, for example, power and/or reference potentials. For example, each interface 932 may include an electromechanical type connection or soldered lead connection to communication bus 914.

A memory device (e.g., memory device 902) may be in an active mode in response to the memory device being selected to drive data bus 918 to a particular state, such as in response to performing a read operation in the memory device. Further, the memory device (e.g., memory device 902) may be in an inactive mode when another memory device (e.g., memory device 906) is selected to drive data bus 918 to a particular state, such as in response to performing a read operation in the other memory device (e.g., memory device 906).

Figure 10:
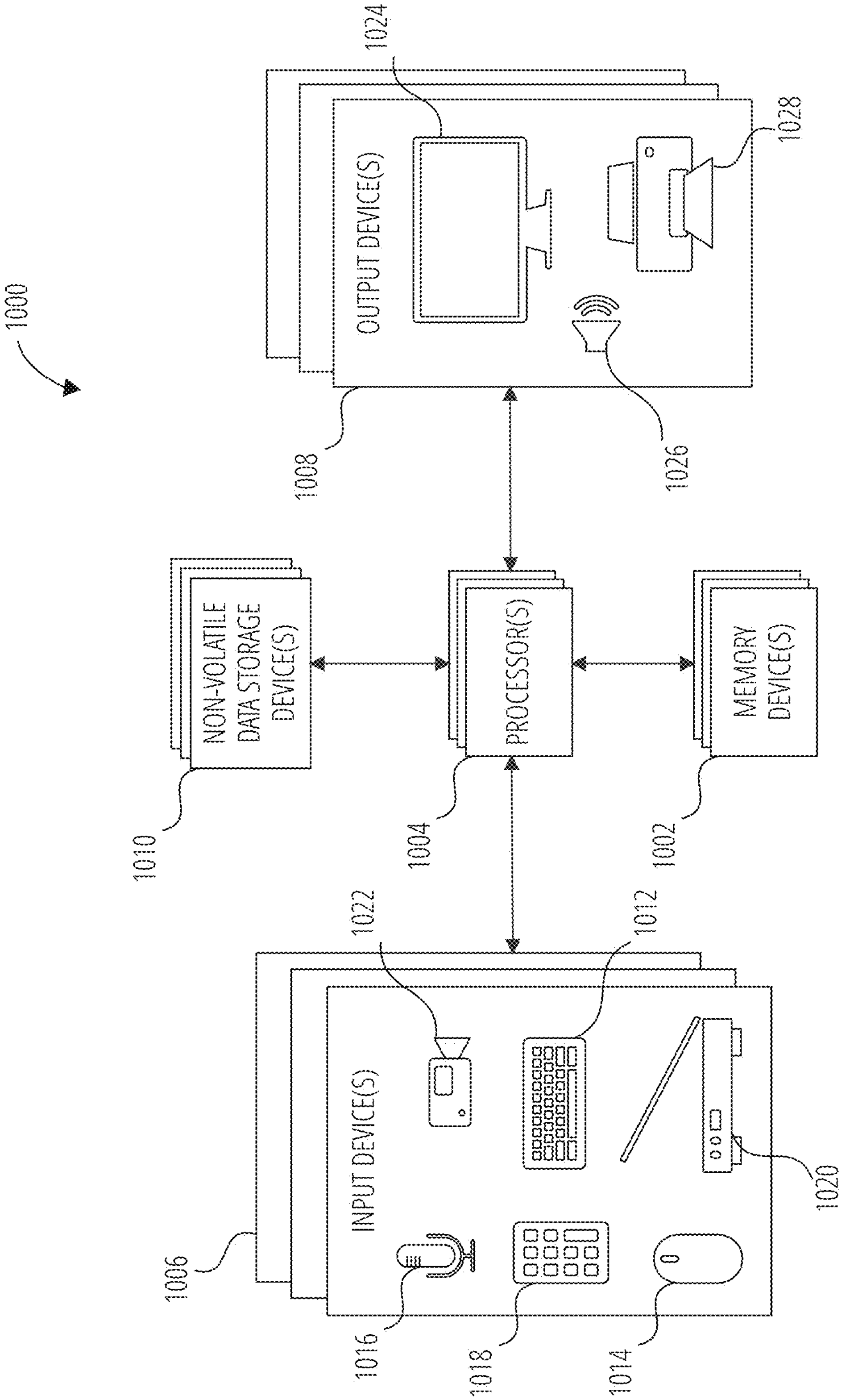
FIG. 10 is a block diagram of a computing system, according to some embodiments.

FIG. 10 is a block diagram of a computing system 1000, according to some embodiments. The computing system 1000 includes one or more processors 1004 operably coupled to one or more memory devices 1002, one or more non-volatile data storage devices 1010, one or more input devices 1006, and one or more output devices 1008. In some embodiments, the computing system 1000 includes a personal computer (PC) such as a desktop computer, a laptop computer, a tablet computer, a mobile computer (e.g., a smartphone, a personal digital assistant (PDA), etc.), a network server, or other computer device.

In some embodiments, the one or more processors 1004 may include a central processing unit (CPU) or other processor configured to control the computing system 1000. In some embodiments, the one or more memory devices 1002 include random-access memory (RAM), such as volatile data storage (e.g., dynamic RAM (DRAM) static RAM (SRAM), etc.). In some embodiments, the one or more memory devices 1002 include the memory apparatus 100 of FIG. 1 and FIG. 3, the error correction circuitry 500 of FIG. 5, the memory device 800 of FIG. 1, and or the memory system 900 of FIG. 9. In some embodiments, the one or more non-volatile data storage devices 1010 include a hard drive, a solid-state drive, Flash memory, erasable programmable read only memory (EPROM), other non-volatile data storage devices, or any combination thereof. In some embodiments, the one or more input devices 1006 include a keyboard 1012, a pointing device 1014 (e.g., a mouse, a track pad, etc.), a microphone 1016, a keypad 1018, a scanner 1020, a camera 1022, other input devices, or any combination thereof. In some embodiments, the output devices 1008 include an electronic display 1024, a speaker 1026, a printer 1028, other output devices, or any combination thereof.

In some embodiments, a computing system includes a memory device. The memory device includes a stack of memory dies. The stack of memory dies includes a plurality of target dies, control circuitry, a master die, inter-die data connectors, and inter-die error correction connectors. Each of the plurality of target dies includes data storage elements and error correction circuitry. The error correction circuitry of each of the plurality of target dies is configured to generate error correction information corresponding to read data bits read from the data storage elements. The control circuitry includes error correction circuitry configured to generate error correction information corresponding to write data bits to be written to the data storage elements of one of the plurality of target dies. The master die is configured to serve as an interface between the control circuitry and each of the plurality of target dies. The inter-die data connectors operably couple the master die to each of the plurality of target dies. The inter-die data connectors are configured to conduct the write data bits from the master die to the plurality of target dies and the read data bits from the plurality of target dies to the master die. The inter-die error correction connectors are separate from the inter-die data connectors. The inter-die error correction connectors operably couple the master die to each of the plurality of target dies. The inter-die error correction connectors are configured to conduct the error correction information corresponding to the write data bits from the master die to the plurality of target dies and the error correction information corresponding to the read data bits from the plurality of target dies to the master die.

In some embodiments, an apparatus includes a master die, a target die including data storage elements, inter-die data connectors electrically coupling the master die to the target die, and inter-die error correction connectors electrically coupling the master die the target die. The inter-die data connectors are configured to conduct write data bits from the master die to the target die. The write data bits are to be written to the data storage elements. The inter-die error correction connectors are separate from the inter-die data connectors. The inter-die error correction connectors are configured to conduct error correction information corresponding to the write data bits from the master die to the target die.

In some embodiments, an apparatus includes a master die, a target die, inter-die data connectors, and inter-die error correction connectors. The target die includes data storage elements and error correction circuitry. The error correction circuitry is configured to generate error correction information based on read data bits read from the data storage elements by the target die. The inter-die data connectors electrically couple the master die to the target die. The inter-die data connectors are configured to conduct the read data bits from the target die to the master die. The inter-die error correction connectors electrically couple the master die to the target die. The inter-die error correction connectors are separate from the inter-die data connectors. The inter-die error correction connectors are configured to conduct the error correction information from the master die to the target die.

In some embodiments, a method of operating a stack of memory dies includes receiving, by a master die of the stack of memory dies, write data bits and error correction bits associated with the write data bits from control circuitry; conducting the write data bits to a target die of the stack of memory dies through inter-die data connectors; conducting the error correction information associated with the write data bits to the target die through inter-die error correction connectors; generating, by the target die, new error correction information associated with the write data bits received by the target die from the master die; comparing, by the target die, the error correction information received from the master die to the new error correction information; generating error information responsive to a determination that the error correction information received from the master die is different from the new error correction information; and writing the write data bits to data storage elements of the target die responsive to a determination that the error correction information received from the master die matches the new error correction information.

In some embodiments, a method of operating a stack of memory dies, the method comprising: reading read data bits from data storage elements of a target die of the stack of memory dies; generating, by the target die, error correction information associated with the read data bits; conducting the write data bits to a master die of the stack of memory dies through inter-die data connectors; conducting the error correction information associated with the read data bits to the master die through inter-die error correction connectors; and providing, by the master die, the read data bits and the associated error correction information to control circuitry. In some embodiments, the method further includes generating, by the control circuitry, new error correction information associated with the read data bits provided by the master die; comparing the error correction information received from the master die to the new error correction information; and repeating a read operation if the error correction information received from the master die does not match the new error correction information.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:

a number of dies including a first die and a second die;

the first die configured to:

receive data bits from the second die via inter-die data connectors;

receive error correction information corresponding to the data bits from the second die via inter-die error correction connectors separate from the inter-die data connectors;

generate new error correction information corresponding to the data bits via error correction circuitry; and write the data bits to data storage elements responsive to a determination that the error correction information matches the new error correction information.

2. The apparatus of claim 1, wherein the first die is configured to refrain from writing the data bits to the data storage elements responsive to a determination that the error correction information is different from the new error correction information.

3. The apparatus of claim 2, wherein the first die is configured to provide the error correction information to the second die responsive to the determination that the error correction information is different from the new error correction information.

4. The apparatus of claim 1, wherein the first die comprises:

data shift registers operably coupled to the inter-die data connectors; and error shift registers operably coupled to the inter-die error correction connectors.

5. The apparatus of claim 1, wherein at least some of the inter-die connectors comprise either wire bonds or through-silicon-vias (TSVs).

6. The apparatus of claim 1, wherein the first die is configured to:

receive additional data bits from the data storage elements;

generate additional error correction information corresponding to the additional data bits using the error correction circuitry;

provide the additional data bits to the second die via the inter-die connectors; and provide the error correction information corresponding to the additional data bits to the second die via the inter-die connectors.

7. An apparatus, comprising:

a master die; and a target die coupled to the master die via inter-die data connectors and via inter-die error correction connectors separate from the inter-die data connectors, the target die configured to:

receive write data bits from the master die via the inter-die data connectors;

receive error correction information corresponding to the write data bits from the master die via the inter-die error correction connectors;

generate new error correction information responsive to the write data bits; and provide error information to the master die responsive to the new error correction information being different than the error correction information.

8. The apparatus of claim 7, wherein the master die is configured to serve as an interface between control circuitry and the target die.

9. The apparatus of claim 8, wherein at least some of the inter-die data connectors and the inter-die error correction connectors comprises wire bonds, through-silicon-vias (TSVs), or both.

10. The apparatus of claim 7, wherein the error correction information comprises cyclic redundancy check (CRC) bits.

11. The apparatus of claim 7, wherein the error correction information comprises two error correction bits for every sixteen bits of the write data bits.

12. The apparatus of claim 7, further comprising control circuitry operably coupled to the master die, the control circuitry configured to receive the error information from the master die and repeat a write operation responsive to the error information.

13. The apparatus of claim 7, wherein the master die includes clock circuitry configured to clock target data shift registers of the target die to shift the write data bits from the master die to the target die in two bursts of eight bits each for every nine clock cycles of a clock provided to the clock circuitry.

14. The apparatus of claim 13, wherein the clock circuitry is further configured to clock target error shift registers of the target die to shift the error correction information from the master die to the target die in a single burst of two bits for every nine clock cycles of the clock.

15. An apparatus, comprising:

a master die;

a target die including error correction circuitry configured to generate error correction information based on data bits;

inter-die error correction connectors configured to provide the error correction information between the target die and the master die; and inter-die data connectors separate from the inter-die error correction connectors and configured to provide the data bits between the target die and the master die, wherein the target die is configured to trigger the master die to obtain the data bits from the target die.

16. The apparatus of claim 15, wherein the target die includes clock circuitry configured to trigger the master die to obtain the data bits from the target die.

17. The apparatus of claim 15, wherein the target die is configured to read the data bits from or write the data bits to data storage elements of the target die.

18. The apparatus of claim 15, wherein the error correction information comprises two error correction bits for every sixteen bits of the data bits.

19. A method of operating a stack of memory dies, the method comprising:

receiving, by a master die of the stack of memory dies, data bits and error correction information associated with the data bits from control circuitry;

sending the data bits to a target die of the stack of memory dies through inter-die data connectors;

sending the error correction information to the target die through inter-die error correction connectors separate from the inter-die data connectors;

generating, by the target die, new error correction information associated with the data bits;

comparing, by the target die, the error correction information to the new error correction information; and generating error information responsive to a determination that the error correction information is different from the new error correction information.

20. The method of claim 19, further comprising writing the data bits to data storage elements of the target die responsive to a determination that the error correction information matches the new error correction information.

* * * * *